(12) United States Patent
Yang et al.

(10) Patent No.: US 10,090,487 B2
(45) Date of Patent: Oct. 2, 2018

(54) THIN FILM PACKAGING STRUCTURE, METHOD FOR FABRICATION THEREOF AND DISPLAY DEVICE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Jiuxia Yang, Beijing (CN); Feng Bai, Beijing (CN); Yingzi Wang, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/322,212

(22) PCT Filed: Mar. 17, 2016

(86) PCT No.: PCT/CN2016/076592
§ 371 (c)(1),
(2) Date: Dec. 27, 2016

(87) PCT Pub. No.: WO2016/169370
PCT Pub. Date: Oct. 27, 2016

(65) Prior Publication Data
US 2017/0133632 A1    May 11, 2017

(30) Foreign Application Priority Data
Apr. 23, 2015 (CN) .......................... 2015 1 0198118

(51) Int. Cl.
*H01L 51/56* (2006.01)
*H01L 51/52* (2006.01)

(52) U.S. Cl.
CPC ...... *H01L 51/5262* (2013.01); *H01L 51/5256* (2013.01); *H01L 51/56* (2013.01); *H01L 2251/5369* (2013.01)

(58) Field of Classification Search
CPC ..... H01L 51/52; H01L 51/56; H01L 51/5262; H01L 31/18; H01L 31/0216; H01L 33/08; H01L 33/52; H01L 51/00
(Continued)

(56) References Cited

U.S. PATENT DOCUMENTS

2009/0302744 A1* 12/2009 Kim .................... H01L 51/5275
                                                    313/504
2012/0256202 A1   10/2012 Lee et al.
(Continued)

FOREIGN PATENT DOCUMENTS

CN    101064356 A    10/2007
CN    101533850 A    9/2009
(Continued)

OTHER PUBLICATIONS

China Third Office Action with search report, Application No. 201510198118.4, dated Jul. 4, 2017, 19 pgs.: with English translation.
(Continued)

*Primary Examiner* — Chuong A Luu
(74) *Attorney, Agent, or Firm* — Armstrong Teasdale LLP

(57) ABSTRACT

Embodiments of the disclosure provide a thin film packaging structure including a flexible thin film used for packaging a light-emitting display device, wherein the flexible thin film includes at least two layers of organic film layer, at least one layer of inorganic film layer and a light extraction film
(Continued)

layer, each layer of the inorganic film layer is located between the two layers of the organic film layer, the light extraction film layer is located between the two layers of organic film layer or located on the outer surface of the outermost layer of the organic film layer, and the light extraction film layer includes a plurality of microstructures with the function of light extraction. The thin film packaging structure provided by embodiments of the disclosure can improve the luminous efficiency of the organic light-emitting display device packaged by the thin film packaging structure.

16 Claims, 2 Drawing Sheets

(58) Field of Classification Search
USPC .......................................................... 257/100
See application file for complete search history.

(56) References Cited

U.S. PATENT DOCUMENTS

| | | | |
|---|---|---|---|
| 2014/0361270 A1 | 12/2014 | Cui et al. | |
| 2015/0192728 A1* | 7/2015 | Thompson | G02B 6/0043 362/624 |

FOREIGN PATENT DOCUMENTS

| | | |
|---|---|---|
| CN | 101794810 A | 8/2010 |
| CN | 101933175 A | 12/2010 |
| CN | 101978780 A | 2/2011 |
| CN | 102007616 A | 4/2011 |
| CN | 102074659 A | 5/2011 |
| CN | 102194986 A | 9/2011 |
| CN | 102272973 A | 12/2011 |
| CN | 102694128 A | 9/2012 |
| CN | 103155199 A | 6/2013 |
| CN | 103168373 A | 6/2013 |
| CN | 103258955 A | 8/2013 |
| CN | 103460435 A | 12/2013 |
| CN | 103715366 A | 4/2014 |
| CN | 103928625 A | 7/2014 |
| CN | 104103776 A | 10/2014 |
| CN | 104221180 A | 12/2014 |
| CN | 104362260 A | 2/2015 |
| CN | 204271086 U | 4/2015 |
| CN | 104900812 A | 9/2015 |
| WO | 2014057647 A1 | 4/2014 |

OTHER PUBLICATIONS

China First Office Action, Application No. 201510198118.4, dated Aug. 1, 2016, 15 pps.

China Second Office Action, Application No. 201510198118.4, dated Jan. 20, 2017, 12 pps.

PCT International Search Report and Written Opinion, Application No. PCT/CN2016/076592, dated Jun. 20, 2016, 15 pp.

English Translation of PCT Written Opinion, Application No. PCT/CN2016/076592, dated Jun. 20, 2016, 5 pps.

* cited by examiner

THIN FILM PACKAGING STRUCTURE, METHOD FOR FABRICATION THEREOF AND DISPLAY DEVICE

CROSS REFERENCE TO RELATED APPLICATIONS

This application is a National Stage entry of PCT/CN2016/076592 filed Mar. 17, 2016, which claims the benefit and priority of Chinese Patent Application No. 201510198118.4, filed on Apr. 23, 2015, the disclosures of which are incorporated by reference herein in their entirety as part of the present application.

BACKGROUND

The embodiments of the disclosure relate to thin film packaging structure, method for fabrication thereof and display device.

Active light-emitting device (such as organic light-emitting diode (OLED) device) has advantages of thin and light, wide angle of view, low power dissipation, fast response speed, capable of flexible display, therefore it has been widely used in the field of display and lighting.

However, the light extraction efficiency of the active light-emitting device (such as the OLED device) is lower. For example, the loss of luminous efficiency is greater due to the existence of microcavity structure between the electrode layer and the substrate in the OLED device. Therefore, a solution is required to improve the light extraction efficiency.

BRIEF DESCRIPTION

Embodiments of the disclosure provide a thin film packaging structure, a method for fabrication thereof and a display device, which can solve the problem of the light extraction efficiency.

According to the first aspect of the disclosure, there is provided a thin film packaging structure including a flexible thin film used for packaging a light-emitting display device, the flexible thin film including at least two layers of organic film layer, at least one layer of inorganic film layer and a light extraction film layer, each layer of the inorganic film layer being located between the two layers of organic film layer, the light extraction film layer being located between the two layers of organic film layer or located on the outer surface of the outermost layer of the organic film layer, and the light extraction film layer including a plurality of microstructures with the function of light extraction.

According to an embodiment of the disclosure, the microstructures include conical, cylindrical and/or spherical structure.

According to an embodiment of the disclosure, the materials of the light extraction film layer include organic materials and/or inorganic materials.

According to an embodiment of the disclosure, a protecting layer is set on the light extraction film layer when the light extraction film layer is set on the outer surface of the outmost layer of the organic film layer.

According to an embodiment of the disclosure, the materials of the protecting layer include organic resin.

According to an embodiment of the disclosure, flat materials are set on the light extraction film layer.

According to an embodiment of the disclosure, the flat materials are ultraviolet curing materials or thermal curing materials.

According to the second aspect of the disclosure, there is provided a display device including a light-emitting display device and the above thin film packaging structure covering on the light-emitting display device.

According to the third aspect of the disclosure, there is provided a method for fabricating a thin film packaging structure. The method includes fabricating a flexible thin film including at least two layers of organic film layer, at least one layer of inorganic film layer and a light extraction film layer, wherein each layer of the inorganic film layer is located between the two layers of organic film layer, the light extraction film layer is located between the two layers of organic film layer or located on the outer surface of the outermost layer of the organic film layer, and the light extraction film layer includes a plurality of microstructures with the function of light extraction.

According to an embodiment of the disclosure, the microstructures include conical, cylindrical and/or spherical structure.

According to an embodiment of the disclosure, the materials of the light extraction film layer include organic materials and/or inorganic materials.

According to an embodiment of the disclosure, the light extraction film layer is fabricated by printing process or heat evaporation plating process in vacuum.

According to an embodiment of the disclosure, a protecting layer is set on the light extraction film layer when the light extraction film layer is set on the outer surface of the outmost layer of the organic film layer.

According to an embodiment of the disclosure, the materials of the protecting layer include organic resin.

According to an embodiment of the disclosure, the method for fabricating the thin film packaging structure further includes performing planarization processing on the surface of the light extraction film layer.

According to an embodiment of the disclosure, performing the planarization processing on the surface of the light extraction film layer by ultraviolet curing process, which includes coating ultraviolet curing materials on the surface of the light extraction film layer and curing the ultraviolet curing materials, or coating thermal curing materials on the surface of the light extraction film layer and thermocuring the thermal curing materials.

According to an embodiment of the disclosure, the organic film layer is fabricated by ink jet printing process or chemical vapor deposition process and cured.

According to an embodiment of the disclosure, coating inorganic material solution on the organic film layer, roasting and curing by ultraviolet curing process and forming the inorganic film layer, or fabricating the inorganic film layer on the organic film layer by atomic layer deposition process.

The thin film packaging structure of embodiments of the disclosure, by setting the light extraction film layer with the function of light extraction, can improve the luminous efficiency of the light-emitting display device packaged by the thin film packaging structure. In addition, the thin film packaging structure of the disclosure can cause the packaging structure to effectively prevent the permeation of external oxygen and water into the light-emitting display device by alternately setting the organic film layer and the inorganic film layer, and satisfy the package performance of the light-emitting display device. The packaging structure and process thereof can be applied to the packaging of flexible display device.

BRIEF DESCRIPTION OF THE DRAWINGS

In order to illustrate the technique solution of embodiments of the present disclosure more clearly, the accompanying drawings will hereinafter be introduced briefly. It is obvious that the accompanying drawings in the following description are only related to some embodiments of the present disclosure and should not be construed as limiting the present disclosure.

DETAILED DESCRIPTION

To make the technical solutions and advantages of embodiments of the present disclosure more clear, the technical solutions of embodiments of the present disclosure will be described below clearly and completely in connection with the accompanying drawings of embodiments of the present disclosure. It is obvious that the described embodiments are only some, but not all the embodiments of the present disclosure. Based on the embodiments of the disclosure, all the other embodiments made by those of ordinary skill in the art without the premise of creative work belong to the scope of protection of the disclosure.

It is noted that though the embodiments of the disclosure are mainly described in the context of the organic light-emitting display device, it can be understood by those skilled in the art that the embodiments of the disclosure may be applied to any other suitable light emitting display devices, rather than only limited to the organic light emitting display device.

Figure 1:
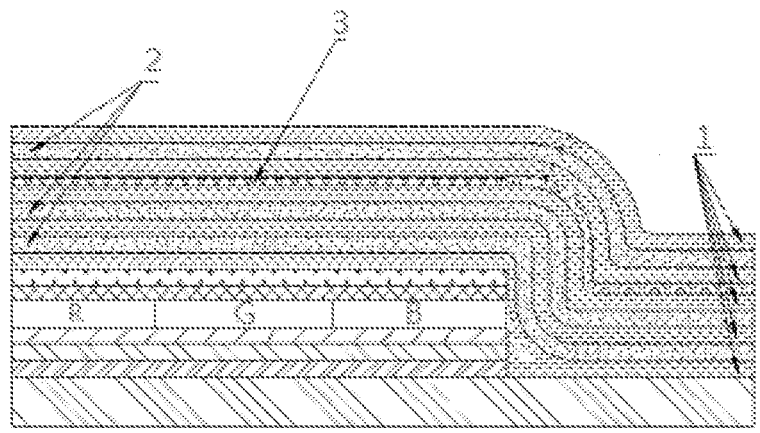
FIG. 1 is a schematic structure diagram of a thin film packaging structure according to an embodiment of the disclosure.
Figure 2:
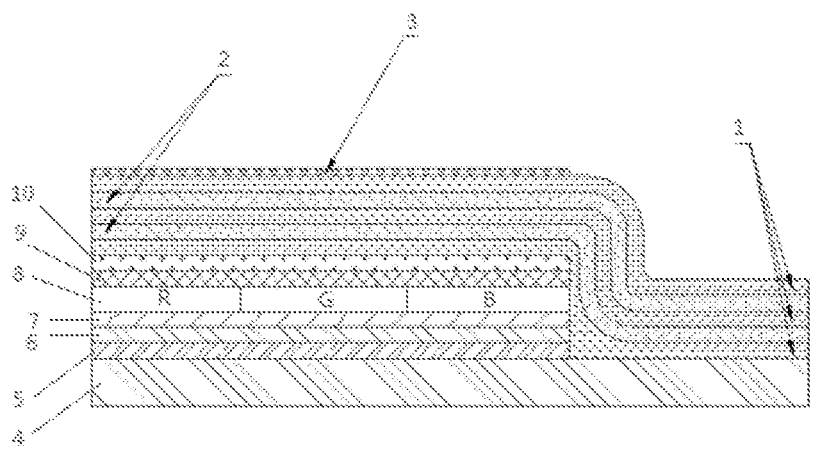
FIG. 2 is a schematic structure diagram of another thin film packaging structure according to an embodiment of the disclosure.

FIG. 1 is a schematic structure diagram of a thin film packaging structure according to an embodiment of the disclosure, and FIG. 2 is a schematic structure diagram of another thin film packaging structure according to an embodiment of the disclosure. As can be seen from FIGS. 1 and 2, the thin film packaging structures of the embodiments include a flexible thin film used for packaging a light-emitting display device, the flexible thin film includes at least two layers of organic film layer 1, at least one layer of inorganic film layer 2 and a light extraction film layer 3, each layer of the inorganic film layer 2 is located between the two layers of organic film layer 1, the light extraction film layer 3 is located between the two layers of organic film layer 2 (see FIG. 1) or located on the outer surface of the outermost layer of the organic film layer 1 (see FIG. 2), and the light extraction film layer 3 includes a plurality of microstructures with the function of light extraction. In general, the thin film packaging structure of embodiments of the disclosure is set at the light emitting side of the light emitting display device, i.e., the light emitted by the light emitting display device can pass the thin film packaging structure.

In addition to the flexible thin film, FIGS. 1 and 2 further show the composition and structure of one of the light emitting display devices which can be packaged by the flexible thin film, wherein the light emitting display device is an organic light-emitting display device in this embodiment. With reference to FIG. 2, a first electrode (such as an anode) is denoted by 5, a hole injection layer is denoted by 6, a hole transport layer is denoted by 7, an organic light emitting layer is denoted by 8, an electron transfer layer is denoted by 9, and a second electrode (such as a cathode) is denoted by 10. Wherein the light extraction film layer 3 can completely covers the organic light emitting layer 8 of the organic light emitting display device. The composition and structure of the organic light emitting display device in FIG. 1 is same as that in FIG. 2, therefore it is not marked in detail in FIG. 1. In addition, the flexible thin film can package any other light emitting display devices with suitable structure, rather than is not limited to only the organic light emitting display device.

In this embodiment, the microstructures include conical, cylindrical and/or spherical structure (not shown in FIGS. 1 and 2).

In an example of this embodiment, the light extraction film layer 3 includes a plurality of conical structures with the function of light extraction.

In an embodiment, flat materials may be set on the light extraction film layer 3. The flat materials may be ultraviolet curing materials or thermal curing materials. Since the light extraction film layer 3 includes a plurality of conical, cylindrical or spherical structures, flat materials set on the light extraction film layer 3 can protect other film layers or structures on the light extraction film layer 3 and keep flat.

In an embodiment, the materials of the light extraction film layer 3 include organic materials and/or inorganic materials, i.e., the microstructures with the function of light extraction can be fabricated by the organic materials or the inorganic materials.

In order to save materials and process steps, the sum of the number of layers of the organic film layer 1, the inorganic film layer 2 and the light extraction film layer 3 should not be relatively large. For example, the sum of the number of layers of the organic film layer 1, the inorganic film layer 2 and the light extraction film layer 3 may be 5-10 layers.

The thin film packaging structure for packaging the organic light emitting display device according to the embodiment adopts a way of alternate setting of the organic film layer and the inorganic film layer or the light extraction film layer and can effectively prevent the permeation of external oxygen and water into the organic light-emitting display device.

Since the thin film packaging structure for packaging the organic light emitting display device according to this embodiments has set the light extraction film layer includes a plurality of microstructures with the function of light extraction, it can effectively improve the luminous efficiency of the organic light-emitting display device.

Moreover the thin film packaging structure provided by this embodiment can also be applied to the packaging of flexible display device.

In addition, with reference to the thin film packaging structure shown in FIG. 1, since the light extraction film layer is set between the two layers of the organic film layer rather than located on the outer surface of the outermost layer of the organic film layer, the thin film packaging structure shown in FIG. 1 can effectively protect the light extraction film layer from damage and improve the life time and using effect of the thin film packaging structure.

Figure 3:
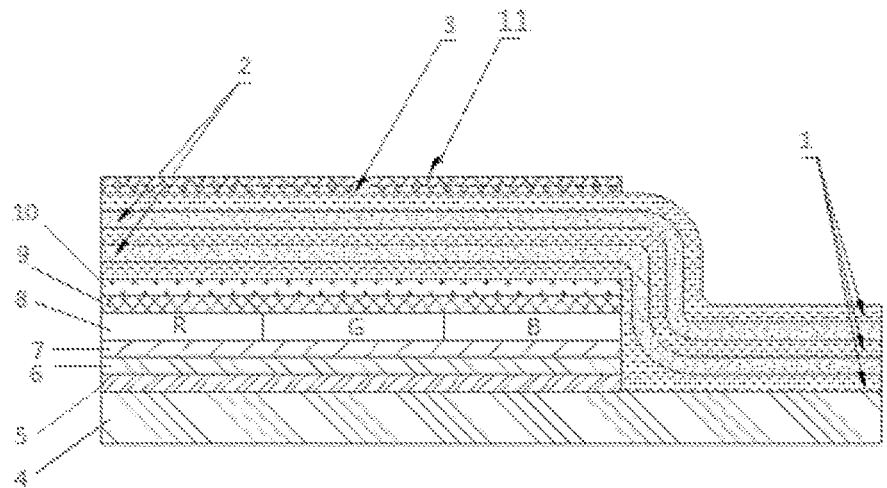
FIG. 3 is a schematic structure diagram of a thin film packaging structure according to another embodiment of the disclosure.

FIG. 3 is a schematic structure diagram of a thin film packaging structure according to another embodiment of the disclosure. In addition to a protecting layer 11 being set on the light extraction film layer 3, the structure of the thin film packaging structure shown in FIG. 3 is same as that in FIG. 2. For the same parts, they are not described in detail herein. In this embodiment, the materials of the protecting layer include organic resin.

When the light extraction film layer 3 is set on the outer surface of the outmost layer of the organic film layer 1, the protecting layer 11 is set on the light extraction film layer 3 in order to protect the light extraction film layer 3 from damage.

In an embodiment, flat materials may be set between the light extraction film layer 3 and the protecting layer 11. The flat materials may be ultraviolet curing materials or thermal curing materials.

Since the protecting layer 11 is set on the light extraction film layer 3 when the light extraction film layer 3 is set on the outer surface of the outmost layer of the organic film layer 1, comparing with the thin film packaging structure of embodiments above, the thin film packaging structure of this embodiment can effectively protect the light extraction film layer from damage and improve the life time and using effect of the thin film packaging structure.

There is provided a display device according to an embodiment of the disclosure. The display device includes a light-emitting display device and the thin film packaging structure according to any one of mentioned above embodiments, wherein the thin film packaging structure covers on the light-emitting display device. The structure of the light-emitting display device may use the structure shown in FIG. 3.

Since the thin film packaging structures of above embodiments may be applied to the packaging of the flexible display device, the display device of this embodiment may be the flexible display device.

Since the display device according to the embodiment of the disclosure adopts the thin film packaging structure of above embodiments, it has relatively higher luminous efficiency.

The display device of the embodiments of the disclosure may be applied to products with the display functionality, such as mobile phone, tablet, video camera, television, printer, etc.

Figure 4:
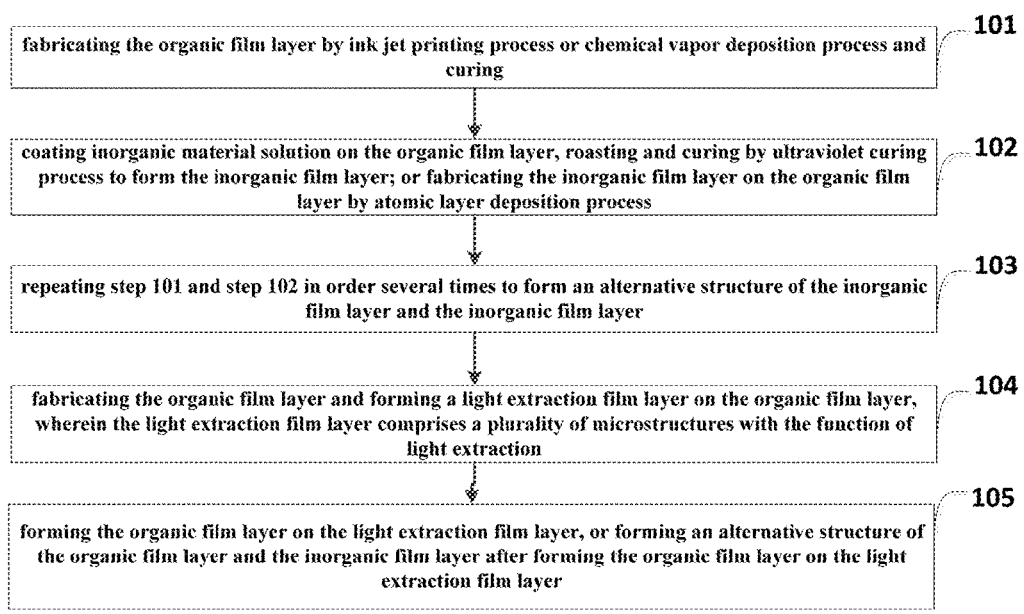
FIG. 4 is a flow chart of a method for fabricating a thin film packaging structure according to an embodiment of the disclosure.

FIG. 4 is a flow chart of a method for fabricating a thin film packaging structure according to an embodiment of the disclosure. As shown in FIG. 4, the method for fabricating the thin film packaging structure includes fabricating a flexible thin film including at least two layers of organic film layer, at least one layer of inorganic film layer and a light extraction film layer, wherein each layer of the inorganic film layer is located between the two layers of organic film layer, the light extraction film layer is located between the two layers of organic film layer or located on the outer surface of the outermost layer of the organic film layer, and the light extraction film layer includes a plurality of microstructures with the function of light extraction. The microstructures include conical, cylindrical and/or spherical structure.

Specifically, the method for fabricating the thin film packaging structure according to this embodiment includes the following:

Step 101: fabricating the organic film layer by ink jet printing process or chemical vapor deposition process and curing.

In this step, the organic film layer is fabricated on the light emitting display device (such as the organic light-emitting display device) by ink jet printing process or chemical vapor deposition process and cured.

Step 102: coating inorganic material solution on the organic film layer, roasting and curing by ultraviolet curing process to form the inorganic film layer; or fabricating the inorganic film layer on the organic film layer by atomic layer deposition process.

Step 103: repeating step 101 and step 102 in order several times to form an alternative structure of the inorganic film layer and the inorganic film layer.

Step 104: fabricating the organic film layer and forming a light extraction film layer on the organic film layer, wherein the light extraction film layer includes a plurality of microstructures with the function of light extraction.

In this step, the process for forming the light extraction film layer includes:

A1. designing the microstructures in the light extraction film layer, in general, the microstructures including one or more of conical, cylindrical and/or spherical structure.

A2. fabricating the microstructures designed in A1 by adopting printing process or heat evaporation plating process in vacuum, and forming the light extraction film layer. When fabricating the microstructures by adopting the heat evaporation plating process in vacuum, it is required to cooperate masking to complete the fabrication of a pattern.

In this embodiment, the formed light extraction film layer should be able to completely cover the light emitting layer (such as the organic light emitting layer) of the light emitting display device (such as the organic light emitting display device).

In an embodiment, the materials of the light extraction film layer include organic materials and/or inorganic materials. In other words, the materials of the microstructures may be fabricated by adopting the organic materials or the inorganic materials.

In an embodiment, performing the planarization processing on the surface of the light extraction film layer after forming the light extraction film layer includes performing the planarization processing on the surface of the light extraction film layer by adopting ultraviolet curing process, which includes coating ultraviolet curing materials on the surface of the light extraction film layer and curing the ultraviolet curing materials, or coating thermal curing materials on the surface of the light extraction film layer and thermocuring the thermal curing materials.

Step 105: forming the organic film layer on the light extraction film layer, or forming an alternative structure of the organic film layer and the inorganic film layer after forming the organic film layer on the light extraction film layer.

In order to save materials and process steps, the sum of the number of layers of the organic film layer, the inorganic film layer and the light extraction film layer should not be relatively large. For example, the sum of the number of layers of the organic film layer, the inorganic film layer and the light extraction film layer may be 5-10 layers.

In another instance of the embodiment, the method for fabricating the thin film packaging structure is slightly different from that of the above embodiment. In this embodiment, step 105 is not performed any more after completing step 104. In this case, the light extraction film layer is formed on the outer surface of the outmost layer of the organic film layer. Different from the above thin film packaging structure within which it has the microstructures with the function of light extraction, the microstructures with the function of light extraction is designed on the outer surface of the thin film packaging structure in this embodiment.

In this embodiment, the protecting layer is set on the light extraction film layer when the light extraction film layer is set on the outer surface of the outmost layer of the organic film layer. In other embodiments, the protecting layer may also not be set, but the light extraction film layer is fitted directly with the exterior cover of the display device. When the protecting layer is set, the materials of the protect layer include organic resin.

The method for fabricating the thin film packaging structure according to the embodiment can be used to fabricate the thin film packaging structure of embodiments above. Since the embodiment has designed the microstructures with the function of light extraction (the light extraction film layer) when fabricating the thin film packaging structure, the luminous efficiency of light-emitting display device can be improved effectively when the thin film packaging structure fabricated by adopting the embodiment is used to package the light emitting display device (such as the organic light emitting display device). In addition, since the embodiment adopts a way of alternate setting of the organic film layer and the inorganic film layer, the permeation of external oxygen and water into the light-emitting display device (such as the organic light emitting display device) can be prevented effectively.

The embodiments above are only for illustrating the technical solutions of the disclosure rather than limiting the disclosure. Though the disclosure have been described in detail with reference to embodiments, it should be understood by those ordinary skilled in the art that various modifications and equivalent replacements of a part of technical features of the technical solution of above-mentioned embodiments of the disclosure can be made without departing from the spirit and scope of the disclosure, and these modifications and replacements should be deemed as within the protect scope of the disclosure.

What is claimed is:

1. A thin film packaging structure comprising a flexible thin film used for packaging a light-emitting display device, the flexible thin film comprising at least two layers of organic film layer, at least one layer of inorganic film layer, and a light extraction film layer, each layer of the at least one inorganic film layer located between two layers of the at least two organic film layers, the light extraction film layer located between the two layers of the at least two organic film layers or located on an outer surface of an outermost layer of the organic film layer, the light extraction film layer comprising a plurality of microstructures configured for light extraction, wherein flat materials are set on the light extraction film layer, and wherein the flat materials are one of ultraviolet curing materials and thermal curing materials.

2. The thin film packaging structure according to claim 1, wherein the microstructures comprise at least one of conical, cylindrical, and spherical structures.

3. The thin film packaging structure according to claim 1, wherein materials of the light extraction film layer comprise at least one of organic materials and inorganic materials.

4. The thin film packaging structure according to claim 1, wherein a protecting layer is set on the light extraction film layer when the light extraction film layer is set on the outer surface of the outmost layer of the organic film layer.

5. The thin film packaging structure according to claim 4, wherein the materials of the protecting layer comprise organic resin.

6. A display device comprising a light-emitting display device and the thin film packaging structure according to claim 1, wherein the thin film packaging structure covers the light-emitting display device.

7. A method for fabricating a thin film packaging structure, comprising fabricating a flexible thin film comprising at least two layers of organic film layer, at least one layer of inorganic film layer, and a light extraction film layer, wherein each layer of the at least one inorganic film layer is located between two layers of the at least two organic film layers, wherein the light extraction film layer is located between the two layers of the at least two organic film layers or located on an outer surface of an outermost layer of the organic film layer, and wherein the light extraction film layer comprises a plurality of microsctructers configured for light extraction wherein the flat materials are set on the light extraction film layer; and wherein the flat materials are one of ultraviolet curing materials and thermal curing materials.

8. The method for fabricating the thin film packaging structure according to claim 7, wherein the microstructures comprise at least one of conical, cylindrical, and spherical structures.

9. The method for fabricating the thin film packaging structure according to claim 7, wherein the materials of the light extraction film layer comprise at least one of organic materials and inorganic materials.

10. The method for fabricating the thin film packaging structure according to claim 7, wherein the light extraction film layer is fabricated by at least one of printing process and a heat evaporation plating process in vacuum.

11. The method for fabricating the thin film packaging structure according to claim 7, wherein a protecting layer is set on the light extraction film layer when the light extraction film layer is set on the outer surface of the outmost layer of the organic film layer.

12. The method for fabricating the thin film packaging structure according to claim 11, wherein the materials of the protecting layer comprise organic resin.

13. The method for fabricating the thin film packaging structure according to claim 7, wherein the organic film layer is fabricated by one of an ink jet printing process and a chemical vapor deposition process and cured.

14. The method for fabricating a thin film packaging structure according to claim 7, further comprising i) coating inorganic material solution on the organic film layer and roasting and curing the inorganic material using an ultraviolet curing process to form the inorganic film layer; or ii) fabricating the inorganic film layer on the organic film layer by atomic layer deposition process.

15. The method for fabricating a thin film packaging structure according to claim 8, further comprising i) coating inorganic material solution on the organic film layer and roasting and curing the inorganic material using an ultraviolet curing process to form the inorganic film layer; or ii) fabricating the inorganic film layer on the organic film layer by atomic layer deposition process.

16. The method for fabricating a thin film packaging structure according to claim 9, further comprising i) coating inorganic material solution on the organic film layer and roasting and curing the inorganic material using an ultraviolet curing process to form the inorganic film layer; or ii) fabricating the inorganic film layer on the organic film layer by atomic layer deposition process.

* * * * *

UNITED STATES PATENT AND TRADEMARK OFFICE
CERTIFICATE OF CORRECTION

PATENT NO. : 10,090,487 B2
APPLICATION NO. : 15/322212
DATED : October 2, 2018
INVENTOR(S) : Jiuxia Yang et al.

Page 1 of 1

It is certified that error appears in the above-identified patent and that said Letters Patent is hereby corrected as shown below:

In the Claims

In Claim 7, Column 8, Line 15, delete "microsctructers configured" and insert therefor -- microstructures configured --.
In Claim 7, Column 8, Line 16, delete "extraction wherein the flat materials" and insert therefor -- extraction, wherein flat materials --.

Signed and Sealed this
Fifteenth Day of January, 2019

Andrei Iancu
*Director of the United States Patent and Trademark Office*